(12) United States Patent
Huang et al.

(10) Patent No.: US 9,869,928 B2
(45) Date of Patent: Jan. 16, 2018

(54) EXTREME ULTRAVIOLET LIGHT (EUV) PHOTOMASKS, AND FABRICATION METHODS THEREOF

(71) Applicant: Taiwan Semiconductor Manufacturing Company, Ltd., Hsin-Chu (TW)

(72) Inventors: Tao-Min Huang, Yangmei (TW); Chih-Tsung Shih, Hsin-Chu (TW); Chia-Jen Chen, Jhudong Township (TW); Hsin-Chang Lee, Zhubei (TW); Anthony Yen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 92 days.

(21) Appl. No.: 15/096,009

(22) Filed: Apr. 11, 2016

(65) Prior Publication Data
US 2016/0223900 A1     Aug. 4, 2016

Related U.S. Application Data

(63) Continuation of application No. 13/950,020, filed on Jul. 24, 2013, now Pat. No. 9,310,675.

(60) Provisional application No. 61/788,014, filed on Mar. 15, 2013.

(51) Int. Cl.
*G03F 1/24* (2012.01)
*G03F 1/80* (2012.01)
*G03F 1/22* (2012.01)
*G03F 1/72* (2012.01)

(52) U.S. Cl.
CPC .................. *G03F 1/24* (2013.01); *G03F 1/22* (2013.01); *G03F 1/72* (2013.01); *G03F 1/80* (2013.01)

(58) Field of Classification Search
None
See application file for complete search history.

(56) References Cited

U.S. PATENT DOCUMENTS

| 2003/0027053 A1 | 2/2003 | Yan |
| 2003/0039894 A1 | 2/2003 | Yan et al. |
| 2012/0045712 A1 | 2/2012 | Chang et al. |
| 2013/0100428 A1 | 4/2013 | Ruoff et al. |

FOREIGN PATENT DOCUMENTS

| CN | 1516827 A | 7/2004 |
| CN | 1695093 A | 11/2005 |
| CN | 102947759 A | 2/2013 |
| JP | 2012209481 A | 10/2012 |

*Primary Examiner* — Stephen Rosasco
(74) *Attorney, Agent, or Firm* — Slater Matsil, LLP

(57) ABSTRACT

Embodiments of EUV photomasks and methods for forming a EUV photomask are provided. The method comprises providing a substrate, a reflective layer, a capping layer, a hard mask layer, and forming an opening therein. An absorber layer is then filled in the opening and over the top surface of the hard mask layer. A planarized process is provided to remove the absorber layer above the top surface of the hard mask layer and form an absorber in the opening, wherein the absorber has a top portion wider than a bottom portion.

20 Claims, 10 Drawing Sheets

EXTREME ULTRAVIOLET LIGHT (EUV) PHOTOMASKS, AND FABRICATION METHODS THEREOF

This application is a continuation application of U.S. application Ser. No. 13/950,020, filed on Jul. 24, 2013, entitled "Extreme Ultraviolet Light (EUV) Photomasks, and Fabrication Methods Thereof," which claims priority to U.S. Provisional Application Ser. No. 61/788,014, filed on Mar. 15, 2013, entitled "Lithography Mask and Methods of Forming and Using the Same," which applications are hereby incorporated herein by reference.

FIELD OF THE INVENTION

The present disclosure relates generally to the field of photomasks used in the fabrication of semiconductor devices, and more particularly, to extreme ultraviolet light (EUV) photomasks, and fabrication methods thereof.

BACKGROUND

In the manufacture of integrated circuits (IC), or chips, patterns representing different layers of the chip are created on a series of reusable photomasks (also referred to herein as masks) in order to transfer the design of each chip layer onto a semiconductor substrate during the manufacturing process. The masks are used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask generally comprises a transparent substrate having an opaque, light-absorbing layer disposed thereon. Conventional masks typically include a glass or quartz substrate having a layer of chromium on one side. The chromium layer is covered with an anti-reflective coating and a photosensitive resist. During a patterning process, the circuit design is written onto the mask, for example, by exposing portions of the resist to an electron beam or ultraviolet light, thereby making the exposed portions soluble in a developing solution. The soluble portion of the resist is then removed, allowing the exposed underlying chromium and anti-reflective layers to be etched (i.e., removed).

With the shrink of critical dimensions (CD), present optical lithography is approaching a technological limit at the 28 nanometers (nm) technology node. Next generation lithography (NGL) is expected to replace the current optical lithography method, for example, in the 22 nm technology node and beyond. There are several NGL candidates such as extreme ultraviolet (EUV) lithography (EUVL), electron projection lithography (EPL), ion projection lithography (IPL), nanoimprint, and X-ray lithography. Of these, EUVL is the most likely successor due to the fact that EUVL has most of the properties of optical lithography, which is a more mature technology as compared with other NGL methods.

However, EUV mask fabrication still has technological challenges to overcome. For example, a pellicle is used in the conventional chromium masks to prevent any unwanted dusts on the mask to be transferred to the chip. However, a pellicle is not feasible for use with an EUV mask because it will absorb the EUV light. Hence, there is a need to clean the surface of the EUV masks without a pellicle thereon. In addition, there is still a need to monitor the dusts on the surface of the EUV masks. Thus, there is a need for improved EUV masks and fabrication methods.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
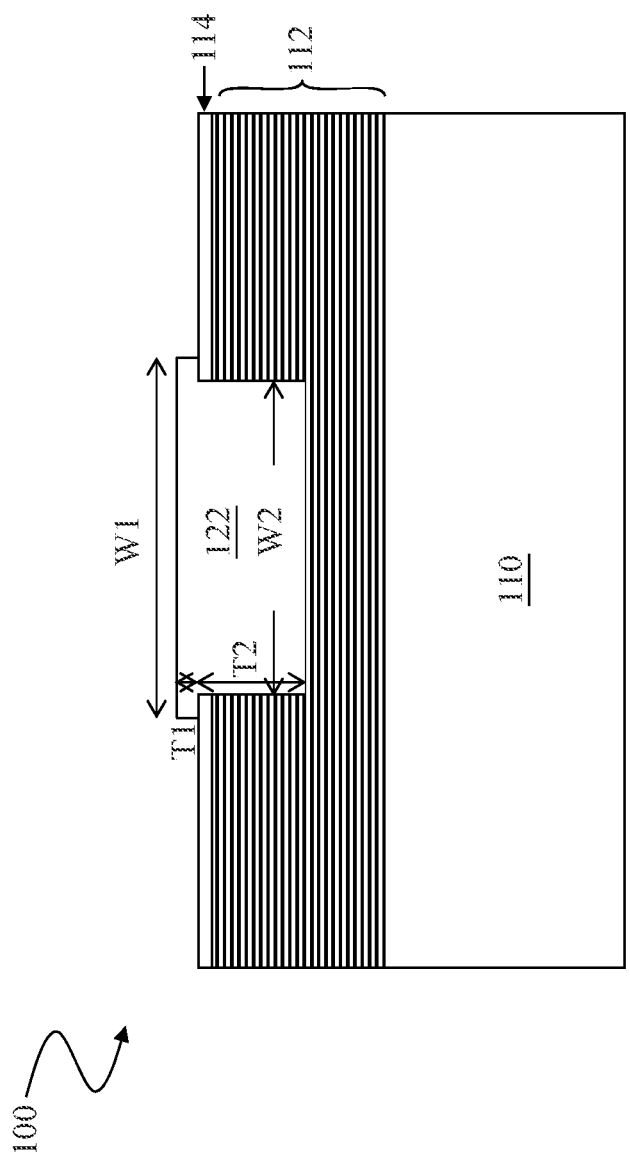
FIG. 1 is a schematic cross-sectional view illustrating an exemplary EUV mask.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic cross-sectional view illustrating an EUV photomask 100. In some embodiments, the EUV photomask 100 include a substrate 110, a reflective layer 112 on the substrate 110, a capping layer 114 on the reflective layer 112, and an absorber 122 in an opening penetrating the capping layer 114 and at least a portion of the reflective layer 112. In some embodiments, the absorber 122 has a top surface higher than the top surface of the capping layer 114. The absorber 122, for example, includes a top portion wider than a bottom portion. In some embodiments, the absorber 122 is T shape. In some embodiments, the absorber 122 has a wide portion over the capping layer 114 and a narrow portion in the capping layer 114.

The substrate 110 may be any size suitable for use as a photomask. In one embodiment, the substrate 110 has a rectangular shape with sides between about 5 inches to about 9 inches in length. In another embodiment, the substrate 110 has a thickness ranging about 0.15 inches and about 0.25 inches. In other embodiment, the substrate 110 is about 0.25 inches thick. In some embodiments, the substrate 110 has a low thermal expansion coefficient (specifically 0±0.05×10$^{-7}$/° C., particularly preferably 0±0.03×10$^{-7}$/° C. at 20° C.), and should be excellent in smoothness, flatness and durability to a cleaning liquid used for cleaning the mask blank or the photomask after the formation of a pattern. The substrate 110 typically comprises a silicon-based material having low thermal expansion coefficient, such as quartz (i.e., silicon dioxide, SiO$_2$), and the like.

The reflective layer 112 can achieve a high reflectivity to EUV light. For example, the reflective layer 112 has reflectivity up to 40% when the surface of the reflective layer 112 is irradiated by the EUV light having wavelength of around 13.5 nm. In the present embodiment, a multilayered reflective film formed by laminating alternately a layer of high refractive index and a layer of low refractive index multiple times is employed as the reflective layer 112. In some embodiments, Mo is employed for the layer of low refractive index and Si is used for the layer of high refractive index for forming the multilayered reflective film of the reflective layer 112. Namely, a Mo/Si multilayered reflective film is formed for forming the reflective layer 112. In one embodiment, the reflective layer 112 may comprise alternating Mo and Si layers ranging between about 40 pairs and about 50 pairs. Each pair of the Mo and Si layers may comprise a Mo layer with a thickness of about 3 nm and a Si layer with a thickness of about 4 nm.

In alternative embodiments, the multilayered reflective film is a Ru/Si multilayered reflective film, a Mo/Be multilayered reflective film, a Mo compound/Si compound multilayered reflective film, a Si/Mo/Ru multilayered reflective film, a Si/Mo/Ru/Mo multilayered reflective film or a Si/Ru/Mo/Ru multilayered reflective film.

The capping layer 114 acts as a capping layer and/or a buffer layer between the reflective layer 112 and a hard mask layer present in an intermediate process for forming photomask. In some embodiments, the capping layer 114 is a silicon (Si) layer, ruthenium (Ru) layer, Ru-containing layer. The capping layer 114, for example, has a thickness ranging between about 1 nm and about 10 nm.

The absorber 122, for example, includes a top portion above the capping layer 114 and a bottom portion within the reflective layer 112 and the capping layer 114. The top portion of the absorber 122 has a width W1 and a thickness T1. The bottom portion of the absorber 122 has a width W2 and a thickness T2. In some embodiments, the absorber 122 has a T-shape with the width W1 greater than the width W2. In the present embodiment, a ratio of the width W1 over the width W2 is ranging between about 1 and about 2. In some embodiments, the thickness T1 is less than the thickness T2. In the present embodiment, the thickness T1 ranges between about 0 nm and about 10 nm. In one embodiment, the thickness T2 is at least larger than 20 nm to prevent light leakage or poor contrast during wafer lithography process. In an alternative embodiment, the thickness T2 is not larger than about 150 nm to prevent the difficulty of performing optical proximity correction (OPC) for forming the mask. In another embodiment, the thickness T2 is the same as the total thickness of the reflective layer 112. In other embodiment, the thickness T2 is the same as the total thickness of the reflective layer 112 and the capping layer 114. In the present embodiment, the thickness T2 ranges between about 20 nm and about 150 nm.

The absorber 122 is an opaque, light-shielding layer. In one embodiment, the absorber 122 comprises tantalum-based materials with essentially no oxygen, such as tantalum silicide-based materials (hereinafter TaSi), nitrogenized tantalum boride-based materials (hereinafter TaBN), and tantalum nitride-based materials (hereinafter TaN). In another embodiment, the absorber 122 comprises tantalum- and oxygen-based materials, such as oxidized (hereinafter TaSiON), tantalum boron oxide-based materials (hereinafter TaBO), and oxidized and nitrogenized tantalum-based materials (hereinafter TaON).

FIGS. 2-8 are schematic cross-sectional views illustrating an exemplary process flow for forming an EUV photomask. Items of FIGS. 2-8 that are the same items in FIG. 1 are indicated by the same reference numerals, increased by 100. With reference to FIGS. 2-8 and 9, an EUV photomask 200 and a method 300 are collectively described below.

Figure 2:
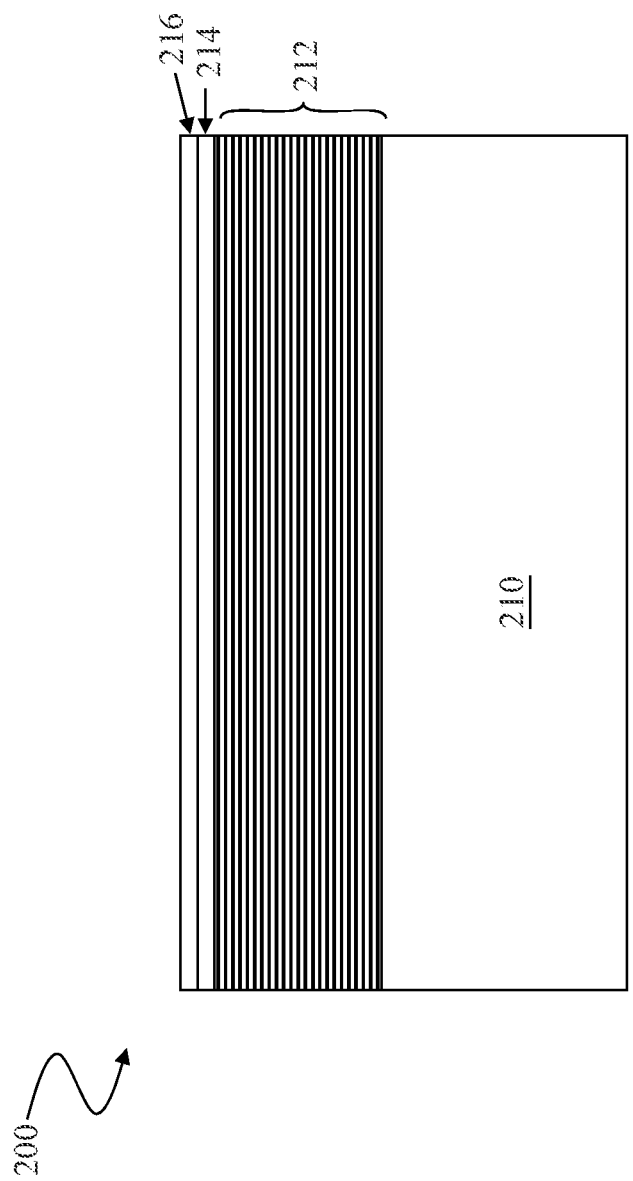
FIGS. 2-8 are various cross-sectional views of embodiments of an EUV mask during various fabrication stages.
Figure 9:
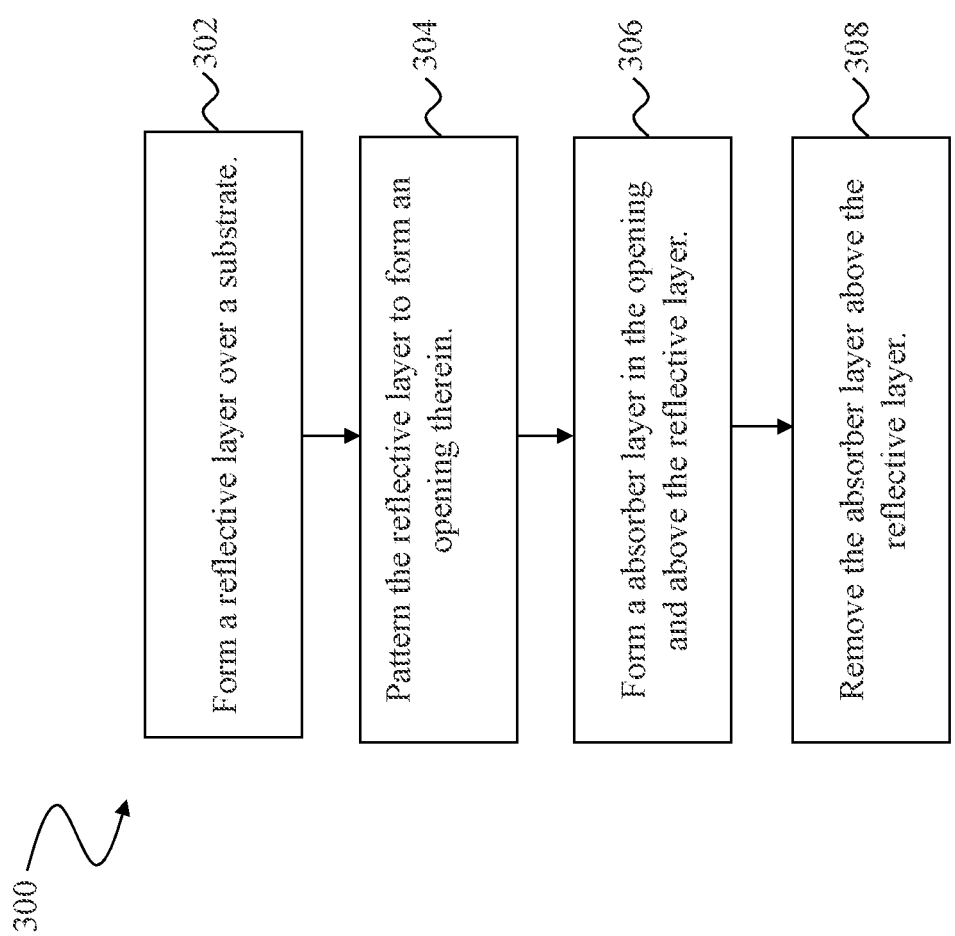
FIG. 9 is a flow chart of a method for fabricating an EUV mask according to aspects of the present disclosure.

Referring to FIGS. 2 and 9, the method 300 begins at step 302 wherein a reflective layer 212 is formed over a substrate 210. In some embodiments, a capping layer 214 is formed over the reflective layer 212. In some embodiments, a hard mask layer 216 is formed over the capping layer 214. In some embodiments, the substrate 210 is a rectangular shape substrate with sides ranging between about 5 inches and about 9 inches in length and has a thickness ranging between about 0.15 inches and 0.25 inches. In some embodiments, the substrate 210 has a low thermal expansion coefficient (specifically 0±0.05×10$^{-7}$/° C., particularly preferably 0±0.03×10$^{-7}$/° C. at 20° C.), and should be excellent in smoothness, flatness and durability to a cleaning liquid used for cleaning the mask blank or the photomask after the formation of a pattern. The substrate 210 typically includes a silicon-based material having low thermal expansion coefficient, such as quartz (i.e., silicon dioxide, SiO$_2$), and the like.

The reflective layer 212 can achieve a high reflectivity to EUV light. For example, the reflective layer 212 has reflectivity up to 40% when the surface of the reflective layer 112 is irradiated by the EUV light having wavelength of around 13.5 nm. In some embodiments, the reflective layer 212 is a multi-material layer. In some embodiments, the multilayered reflective film is formed by laminating alternately a layer of high refractive index and a layer of low refractive index multiple times. In the present embodiment, Mo is employed for the layer of low refractive index and Si is used for the layer of high refractive index for forming the multilayered reflective film of the reflective layer 212. Namely, a Mo/Si multilayered reflective film is formed for forming the reflective layer 112. In one embodiment, the reflective layer 212 may comprise alternating Mo and Si layers ranging between about 40 pairs and about 50 pairs. Each pair of the Mo and Si layers may comprise a Mo layer with a thickness of about 3 nm and a Si layer with a thickness of about 4 nm.

In alternative embodiments, the multilayered reflective film is a Ru/Si multilayered reflective film, a Mo/Be multilayered reflective film, a Mo compound/Si compound multilayered reflective film, a Si/Mo/Ru multilayered reflective film, a Si/Mo/Ru/Mo multilayered reflective film or a Si/Ru/Mo/Ru multilayered reflective film. In some embodiments, the reflective layer 212 is formed by a deposition process, including chemical vapor deposition (CVD), physical vapor deposition (PVD), atomic layer deposition (ALD), and/or other suitable process.

The capping layer 214 may function as a capping layer and/or a buffer layer interposed between the reflective layer 212 and the hard mask layer 216. In the present embodiment, the capping layer 214 is a silicon (Si) layer, ruthenium (Ru) layer, Ru-containing layer. In some embodiments, the capping layer 214 has a thickness ranging between about 1 nm and about 10 nm. In alternative embodiments, the capping layer 214 has a thickness about 2.5 nm. In some embodiments, the capping layer 214 is formed by a deposition process, including CVD, PVD, ALD, and/or other suitable process.

In some embodiments, the hard mask layer 216 includes ruthenium (Ru), RuSi, or a combination thereof. In one embodiment, the hard mask layer 216 has a thickness ranging between about 2 nm and about 15 nm. In another embodiment, the thickness of the hard mask layer 216 is about 5 nm. In some embodiments, the hard mask layer 216 is formed by CVD, PVD, ALD, and/or other suitable process.

Figure 3:
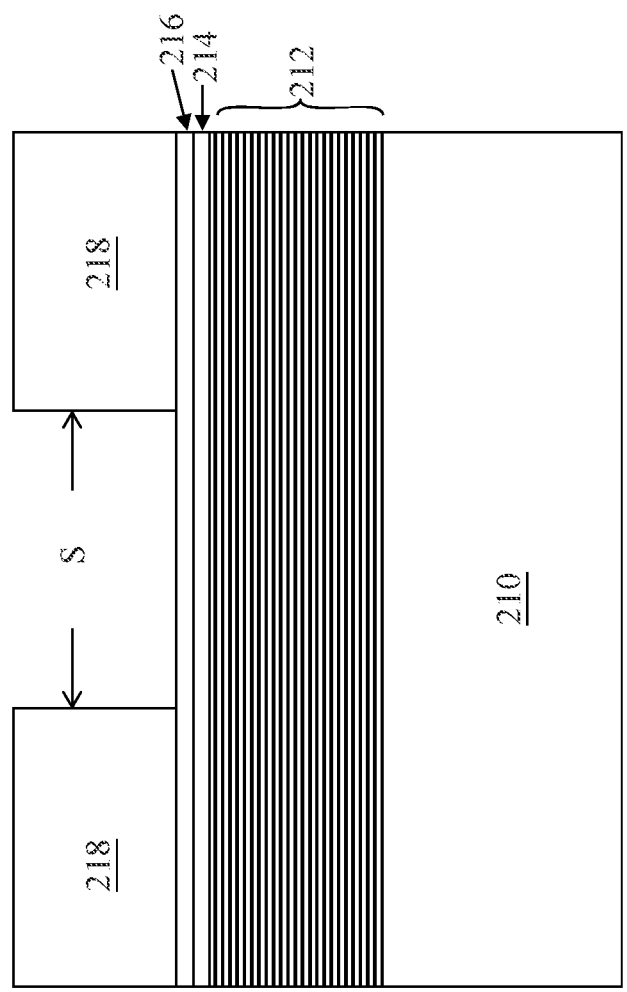
Figure 4:
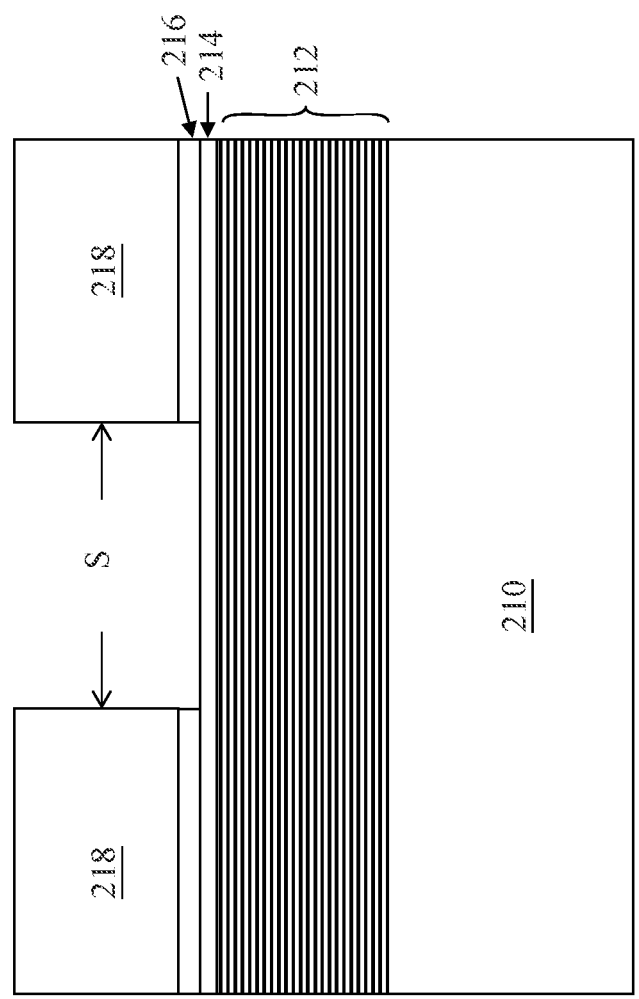
Figure 5:
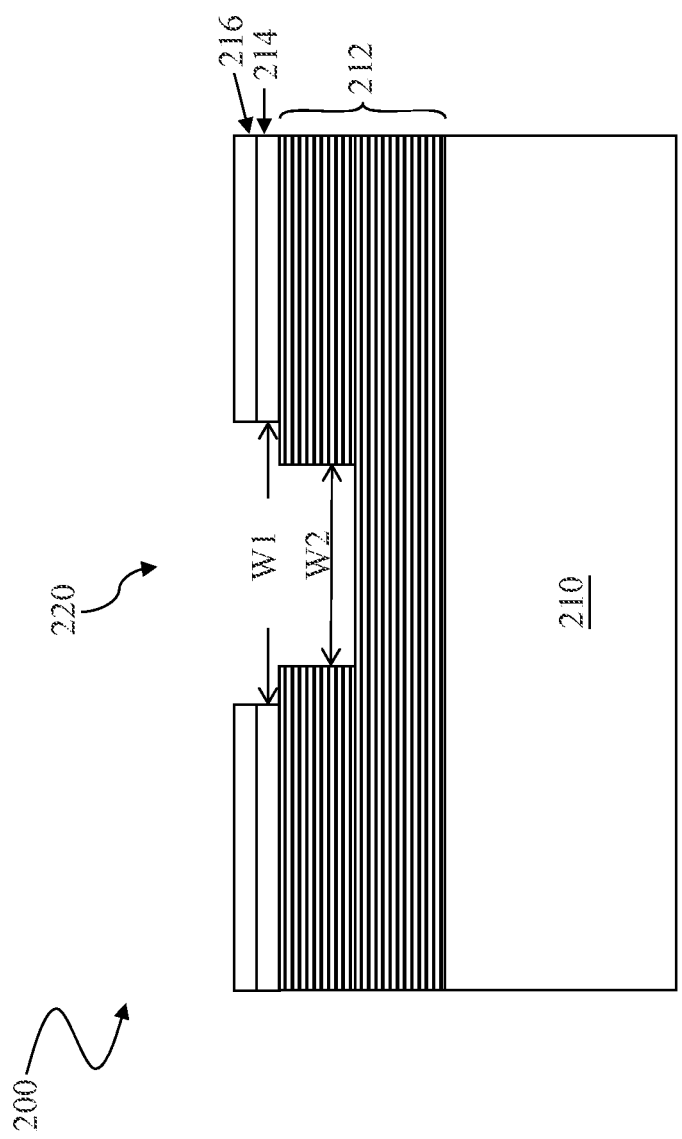

Referring to FIGS. 3-5 and 9, the method 300 continues with step 304 wherein the reflective layer 212 is subjected to a patterning process to form an opening 220 therein. In the present embodiment, the opening 220 is located within the hard mask layer 216, the capping layer 214, and the reflective layer 212 (FIG. 5). The patterning process may include forming photoresist features 218 over the hard mask layer 216 and then removing the portion of the hard mask layer 216 uncovered by the photoresist features 218.

In some embodiments, the process for forming the photoresist features 218 includes forming a layer of photoresist (not shown) over the hard mask layer 216 by a suitable process, such as spin-on coating, and then exposing and developing the layer of photoresist to form the photoresist features 218 separated with a space S (FIG. 3). The photoresist features 218 partially expose the underlying hard mask layer 216. Additionally, an anti-reflective coating (ARC) layer (not shown) may be optionally formed between the hard mask layer 216 and the layer of photoresist to enhance the patterning process.

Referring to FIG. 4, a removing process is performed to remove the portion of the hard mask layer 216 uncovered by the photoresist features 218 and thereby transfer the patterns of the photoresist features 218 to the underlying hard mask layer 216. In some embodiments, the removing process includes an etching process performed using halogen-based gas, e.g., $Cl_2$, $CHF_3$, $CH_3F$, $C_4F_8$, $CF_4$, $SF_6$, $CF_3Cl$, or mixtures thereof to remove the uncovered portion of the hard mask layer 216. Then the etching process stops on the underlying capping layer 214 and expose a portion of the capping layer 214.

Referring to FIG. 5, a portion of the capping layer 214 and the reflective layer 212 are then patterned by a single or multiple removing processes to form the opening 220. The opening 220 has the width W2 within the patterned reflective layer 212 and the width W1 within the patterned capping layer 214. In some embodiments, the width W1 is greater than the width W2. In the present embodiment, a ratio of the width W1 over the width W2 is ranging between about 1 and about 2.

In the present embodiment, the opening 220 is formed by a single dry etching process. An etching selectivity is resulted between the capping layer 214 and the reflective layer 212 during the dry etching process, for example, the etching rate to the capping layer 214 is greater than the etching rate to the reflective layer 212. Therefore, the opening 220 with the width W1 greater than the width W2 is formed by the dry etching process. In some embodiments, the etching process is performed using chlorine-based gas, e.g., $Cl_2$ or $CCl_4$, to remove the portion of capping layer 214 uncovered by the patterned hard mask layer 216 to expose a portion of the underlying reflective layer 212. In one embodiment, at least a portion of the underlying reflective layer 212 is continuously removed after the removal of the capping mask layer 214 during the etching process. In another embodiment, at least a portion of the underlying reflective layer 212 is removed by a separate etching process different from the second etching process. In some embodiments, the reflective layer 212 is removed by using $Cl_2$, $F_2$, or mixture thereof. In one embodiment, the reflective layer 212 is partially removed to a thickness ranging between about 50 nm and about 300 nm. In another embodiment, the reflective layer 212 is completely removed and stops on the surface of the substrate 210.

The photoresist features 218 may be removed after the etching process of the hard mask layer 216, after the etching process of the capping layer 214, or after the etching process of the reflective layer 212. In some embodiments, the removal of the photoresist features 218 is performed by implementing a wet stripping and/or plasma ashing known in the art. For example, an oxygen plasma ashing may be implemented to remove the photoresist features 218.

Figure 6:
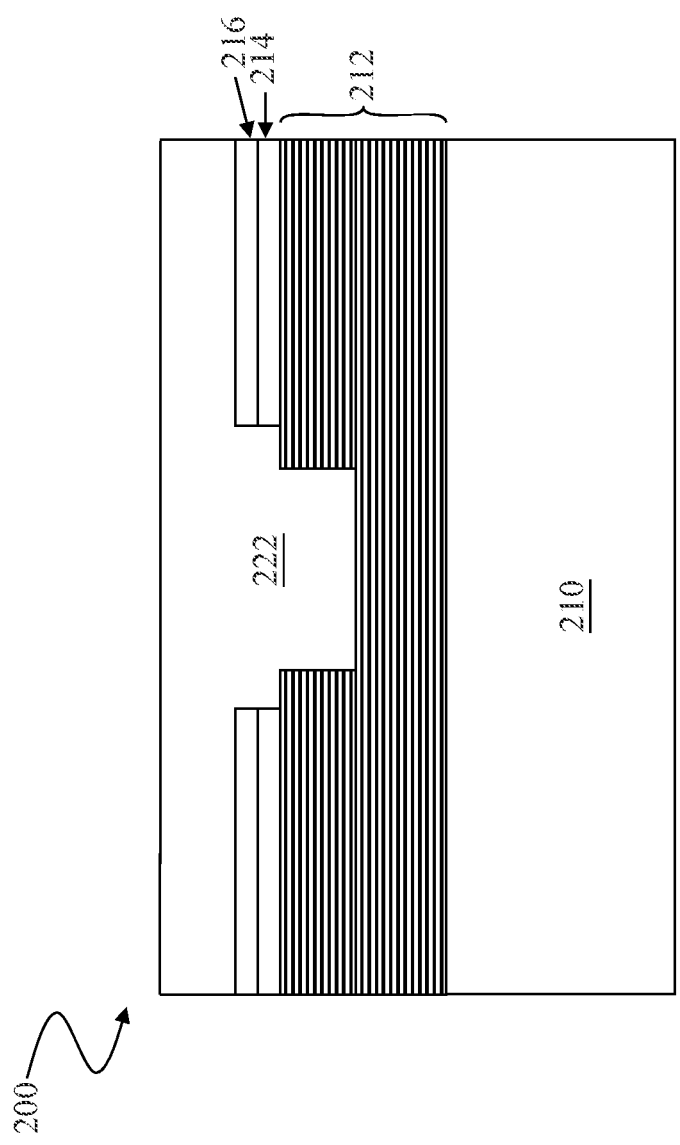

Referring to FIGS. 6 and 9, the method 300 continues with step 306 wherein an absorber layer 222 is filled in the opening 220, above the reflective layer 212, and above the top surface of the hard mask layer 216. The absorber layer 222 is an opaque, light-shielding layer and may have a thickness ranging between about 20 nm and about 500 nm. In one embodiment, the absorber layer 222 comprises tantalum-based materials with essentially no oxygen, such as tantalum silicide-based materials (hereinafter TaSi), nitrogenized tantalum boride-based materials (hereinafter TaBN), and tantalum nitride-based materials (hereinafter TaN). In another embodiment, the absorber layer 222 comprises tantalum- and oxygen-based materials, such as oxidized and nitrogenized tantalum and silicon-based materials (hereinafter TaSiON), tantalum boron oxide-based materials (hereinafter TaBO), and oxidized and nitrogenized tantalum-based materials (hereinafter TaON). The absorber layer 222 may be deposited using PVD such as sputtering and evaporation; plating; CVD such as plasma enhanced CVD (PECVD), atmospheric pressure CVD (APCVD), low pressure CVD (LPCVD), high density plasma CVD (HDP-CVD), atomic layer CVD (ALCVD), other suitable deposition processes, and/or combinations thereof.

Figure 7:
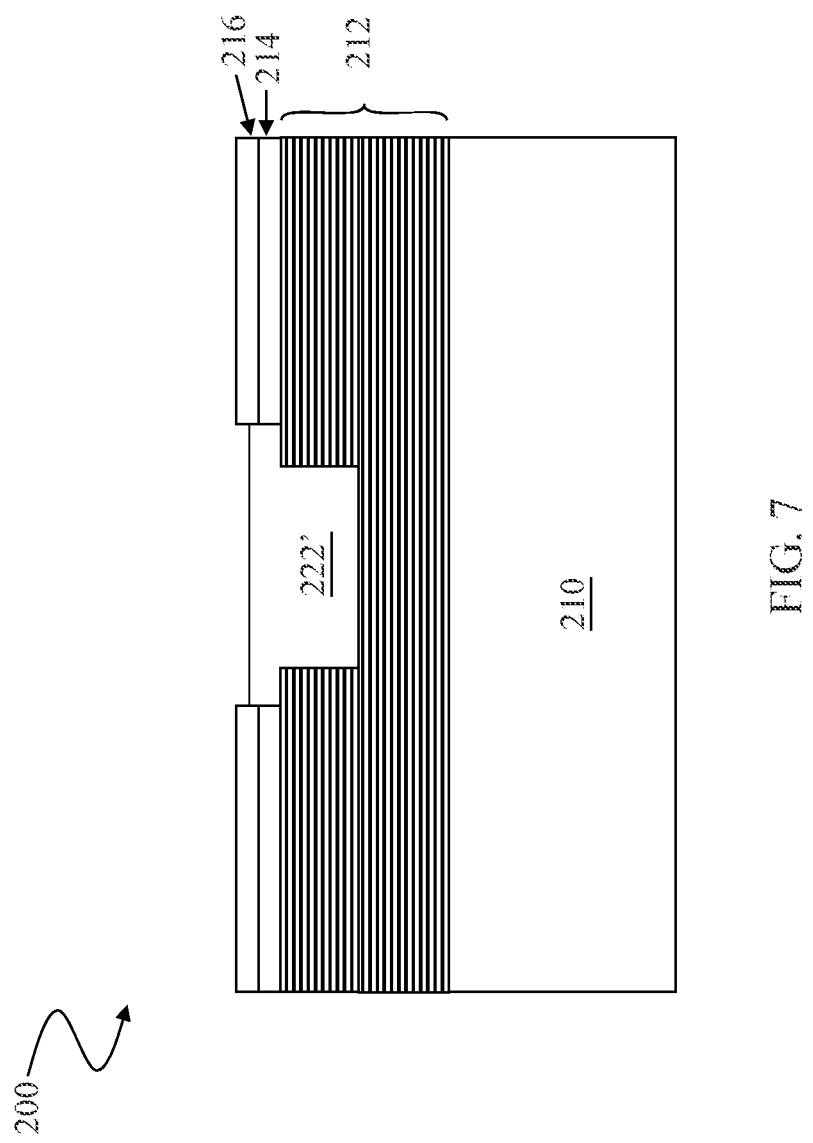
Figure 8:
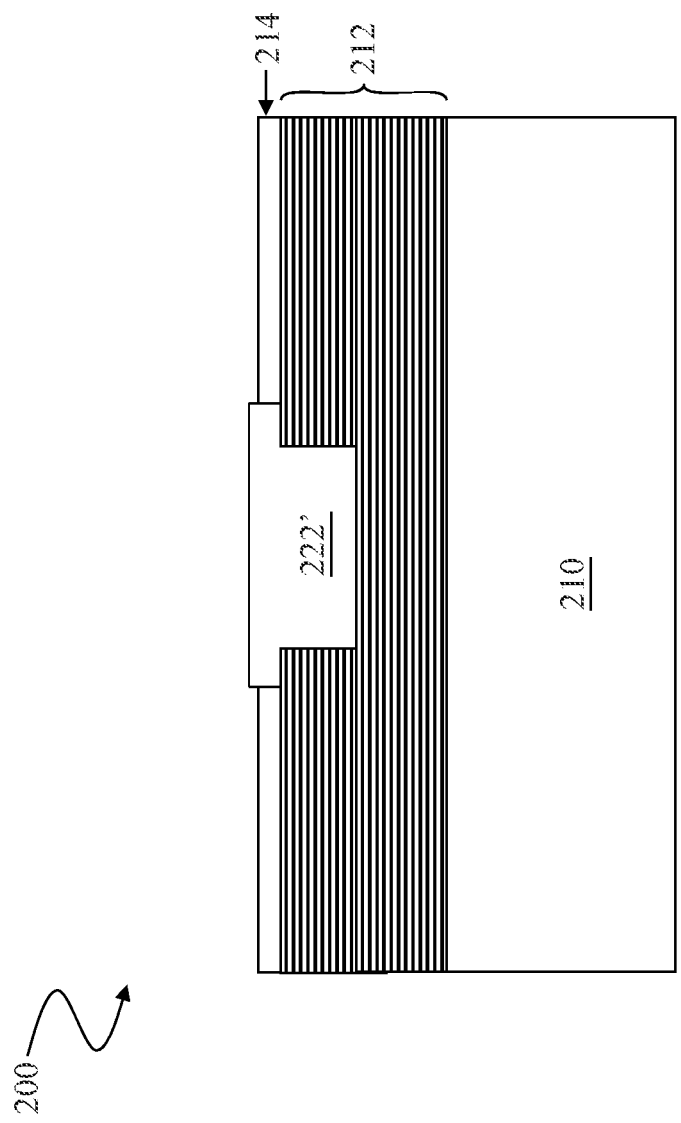

Referring to FIGS. 7 and 8, the method 300 continues with step 308 wherein a removing process is provided to the absorber layer 222. The portion of the absorber layer 222 which is above the opening 220 and the hard mask layer 216 is removed to form an absorber 222' in the opening 220. In some embodiments, the absorber 222' has a top surface substantially co-planar with the top surface of the hard mask layer 216. In alternative embodiments, the absorber 222' has a top surface substantially lower than the top surface of the hard mask layer 216 but higher than the bottom surface of the hard mask layer 216. In one embodiment, the removing process may include a chemical-mechanical polish (CMP) process by using fluoride-base slurry. In another embodiment, the removing process may include a dry etch process by using $CF_4$, $Cl_2$, or a mixture thereof. In other embodiment, the removing process is conducted by a CMP process first to remove a portion of the absorber layer 222 and leave some of the absorber layer 222 above the opening 220 and the hard mask layer 216. Then, a dry etching process is provided to remove the additional absorber layer 222 over the opening 220 to form the absorber 222'. During the CMP or the dry etching process, the hard mask layer 216 may act as a stop layer to stop the CMP or the dry etching process thereon.

Referring to FIG. 8, the hard mask layer 216 is removed after forming the absorber 222'. In some embodiments, the removing process includes a dry etching process. The dry etching process is performed using, for example, halogen-based etching gas, including F-containing gas, e.g., $CF_4$, $SF_6$, $CHF_3$, Cl-containing gas, e.g., $Cl_2$, $CCl_4$, or Br-containing gas, e.g., HBr, $Br_2$. Dilute gas, such as He or Ar, may be added in the etching gas during the etching process. In alternative embodiments, the removing process is wet etching process or CMP.

Figure 10:
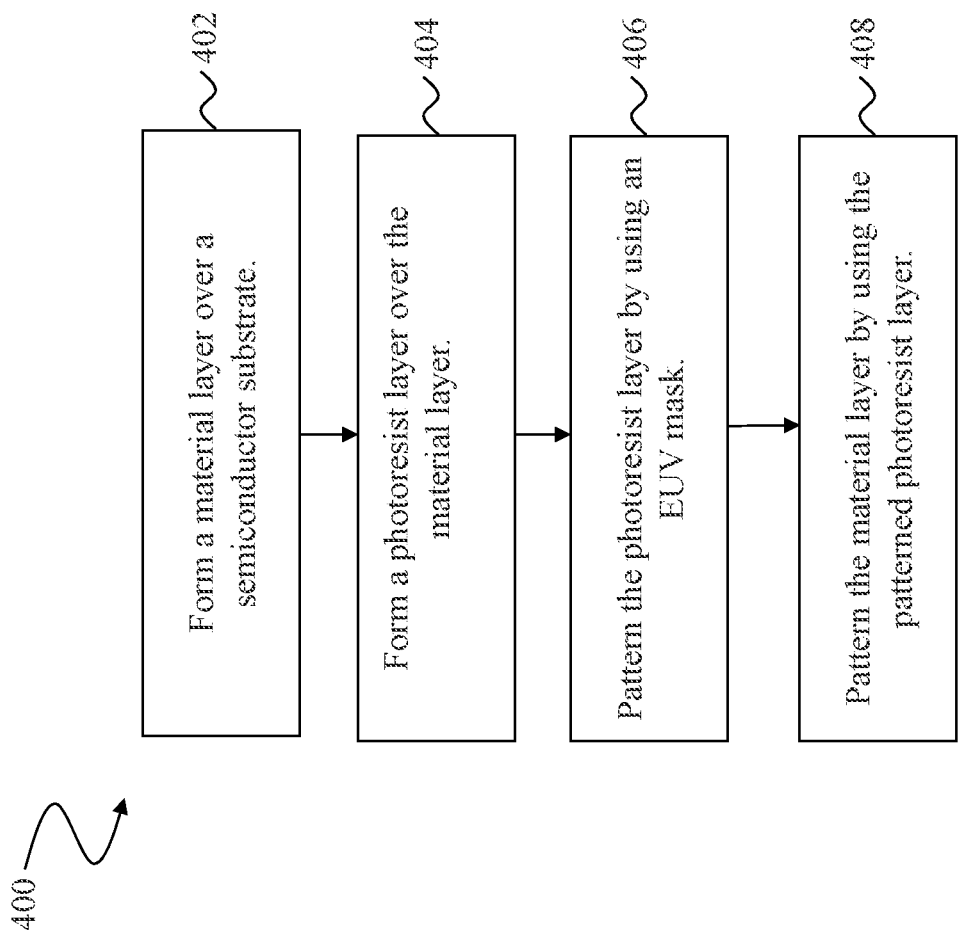
FIG. 10 is a flow chart of a method for fabricating an integrated circuit device by using an EUV mask according to aspects of the present disclosure.

Referring to FIG. 10, a flow chart of a method 400 for fabricating an integrated circuit device by using an EUV mask is described below. The method 400 begins at step 402 wherein a semiconductor substrate having a material layer is provided. The method 400 continues with step 404 to form a photoresist layer over the material layer. Then, the method 400 continues with step 406 to pattern the photoresist layer by using an EUV mask as described above in a lithography process. The method 400 continues with step 408 to pattern the material layer by using the patterned photoresist layer as an etch mask.

It is noted that the EUV masks with the planarized surface are easily cleaned. In addition, dust-monitoring processes are easily performed on the EUV masks having the planarized surface. Furthermore, optical performance, e.g., contrast, may be improved by the T-shaped absorber and the etching process for manufacturing the T-shaped absorber is easily controlled.

It is noted that the integrated circuit devices processed by using the EUV masks are likely to prevent unwanted dusts on the mask to be transferred to the chip.

It is noted that the method described above in conjunction with FIGS. 2-8 is merely exemplary. One of skill in the art can modify the flow of the method to achieve desired EUV photomask. For example, the removing process for removing portions of the absorber layer 222 may form an absorber 222' with a top surface slightly lower than or higher than the top surfaces of the hard mask layer 216.

In still other embodiments, the hard mask layer 216 may be removed during a removing process such that the top surface of the absorber 222' may substantially level with the top surface of the capping layer 214.

In one embodiment, a method of fabricating an extreme ultraviolet photomask, includes providing a mask comprising, in order, a substrate, a reflective layer, and a capping layer; forming an opening having a first portion in the capping layer and a second portion within at least a portion of the reflective layer, wherein the first portion has a width greater than a width of the second portion; forming an absorber layer in the opening and over a top surface of the capping layer; and removing at least a portion of the absorber layer, while leaving another portion of the absorber layer to from a absorber.

In another embodiment, an extreme ultraviolet photomask, includes a reflective layer over a substrate; a capping layer over the reflective layer; and an absorber in the capping layer and the reflective layer. A portion of absorber in the capping is wider than a portion of absorber within the reflective layer.

In still another embodiment, a method for forming an integrated circuit includes forming a photomask by forming a reflective layer over a substrate, forming a capping layer over the reflective layer, and forming an absorber in the capping layer and the reflective layer; forming a layer on a substrate; and patterning the layer using the photomask in a photolithography step. A portion of the absorber in the capping layer is wider than a portion of absorber within the reflective layer.

In yet still another embodiment, a method is provided. The method includes forming a reflective layer over a substrate, the reflective layer comprising a plurality of layers of different materials, forming a cap layer over the reflective layer, and forming a first opening in the cap layer. The method further includes forming a second opening in the reflective layer, the second opening being within the first opening, a width of the second opening being less than a width of the first opening and forming an absorber layer in the first opening and the second opening.

In yet still another embodiment, a method is provided. The method includes forming a first opening in a cap layer, the cap layer being over a reflective layer, the reflective layer being over a substrate, forming a second opening in the reflective layer, the second opening being within lateral boundaries of the first opening, and forming an absorber layer in the first opening and the second opening, the absorber layer extending over at least a portion of the reflective layer.

In yet still another embodiment, a photomask is provided. The photomask includes a reflective layer over a substrate, the reflective layer comprising alternating layers of a first material and a second material, a capping layer over the reflective layer, and an absorber extending through the capping layer and into the reflective layer, wherein a portion of the absorber extends over an uppermost surface of the reflective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, the method comprising:
   forming a reflective layer over a substrate, the reflective layer comprising a plurality of layers of different materials;
   forming a cap layer over the reflective layer;
   forming a first opening in the cap layer;
   forming a second opening in the reflective layer, the second opening being within the first opening, a width of the second opening being less than a width of the first opening; and
   forming an absorber layer in the first opening and the second opening.

2. The method of claim 1, wherein forming the first opening is performed before forming the second opening.

3. The method of claim 1, wherein an uppermost surface of the absorber layer is above an uppermost surface of the cap layer.

4. The method of claim 1, further comprising forming a mask layer over the cap layer prior to forming the first opening.

5. The method of claim 4, further comprising removing the mask layer after forming the absorber layer.

6. The method of claim 5, wherein forming the absorber layer comprises, prior to removing the mask layer:

forming an absorber material in the first opening and the second opening, the absorber material extending over an upper surface of the mask layer; and planarizing the absorber material.

7. The method of claim 6, after planarizing the absorber material, etching the absorber material.

8. The method of claim 6, wherein an uppermost surface of the absorber material is recessed below an uppermost surface of the mask layer.

9. The method of claim 6, wherein an uppermost surface of the absorber material is level with an uppermost surface of the mask layer.

10. A method, the method comprising:

forming a first opening in a cap layer, the cap layer being over a reflective layer, the reflective layer being over a substrate;

forming a second opening in the reflective layer, the second opening being within lateral boundaries of the first opening; and forming an absorber layer in the first opening and the second opening, the absorber layer extending over at least a portion of the reflective layer.

11. The method of claim 10, wherein a mask layer is over the cap layer, and forming the first opening comprises forming the first opening in the mask layer.

12. The method of claim 11, wherein after forming the absorber layer, removing the mask layer.

13. The method of claim 12, wherein forming the absorber layer comprises:

forming an absorber material over an uppermost surface of the cap layer; and removing at least a portion of the absorber material, thereby forming the absorber layer.

14. The method of claim 13, wherein removing at least a portion of the absorber material comprises:

performing a chemical mechanical polishing step to remove at least some of the absorber material; and after performing the chemical mechanical polishing step, performing a dry etch process to remove at least some of the absorber material.

15. The method of claim 10, wherein a ratio of a width of the first opening to a width of the second opening is in a range from about 1 to about 2.

16. The method of claim 10, wherein the absorber layer is TaSi, TaBN, TaN, TaSiON, TaBO, or TaON.

17. The method of claim 10, wherein the reflective layer comprises a Mo containing layer and a Si containing layer.

18. A photomask, comprising:

a reflective layer over a substrate, the reflective layer comprising alternating layers of a first material and a second material;

a capping layer over the reflective layer; and an absorber extending through the capping layer and into the reflective layer, wherein a portion of the absorber extends over an uppermost surface of the reflective layer.

19. The photomask of claim 18, wherein the reflective layer comprises alternating layers of the first material, the second material, and one or more additional materials.

20. The photomask of claim 18, wherein the absorber comprises a tantalum-based material.

* * * * *